United States Patent [19]

Lim et al.

[11] Patent Number: 5,837,600
[45] Date of Patent: Nov. 17, 1998

[54] METHOD FOR FABRICATING A SEMICONDUCTOR DEVICE

[75] Inventors: Jae Eun Lim; Jong Choul Kim, both of Ichon-shi, Rep. of Korea

[73] Assignee: Hyundai Electronics Industries Co., Ltd., Kyoungki-do, Japan

[21] Appl. No.: 669,916

[22] Filed: Jun. 25, 1996

[30] Foreign Application Priority Data

Jun. 30, 1995 [KR] Rep. of Korea ................. 1995-18866

[51] Int. Cl.⁶ ..................... H01L 21/3205; H01L 21/336
[52] U.S. Cl. ........................................ 438/592; 438/301
[58] Field of Search ................... 438/592, 301; 148/DIG. 147

[56] References Cited

U.S. PATENT DOCUMENTS

| | | |
|---|---|---|
| 4,833,099 | 5/1989 | Woo . |
| 4,935,380 | 6/1990 | Okumura . |
| 5,350,698 | 9/1994 | Huang et al. ........................ 438/592 |
| 5,368,686 | 11/1994 | Tatsumi et al. ..................... 438/592 |
| 5,441,904 | 8/1995 | Kim et al. ........................... 438/592 |
| 5,518,960 | 5/1996 | Tsuchimoto ........................ 438/592 |
| 5,541,131 | 7/1996 | Yoo et al. ............................ 438/592 |
| 5,612,236 | 3/1997 | Mikata et al. ...................... 438/592 |
| 5,618,755 | 4/1997 | Ito ....................................... 438/592 |

FOREIGN PATENT DOCUMENTS 62-92448   4/1987   Japan ..................... 148/DIG. 147

Primary Examiner—Charles L. Bowers, Jr.
Assistant Examiner—Toniae M. Thomas
Attorney, Agent, or Firm—Gary M. Nath; Nath & Associates

[57] ABSTRACT

Disclosed is a method for fabricating a semiconductor device, especially suitable for a highly-integrated semiconductor device. In the method, a lower tungsten silicide film having an amorphous construction is formed on a poly silicon film on a gate oxide film formed on a semiconductor substrate. On the lower tungsten silicide film, an upper tungsten silicide film having a plurality of small grains between which gaps are defined. Thereafter, oxide films are formed on the crystallized grains by heat treatment under an oxygen atmosphere.

7 Claims, 2 Drawing Sheets

METHOD FOR FABRICATING A SEMICONDUCTOR DEVICE

BACKGROUND OF THE INVENTION

1. Field of the Invention

The present invention relates to a method for fabricating a semiconductor device, and more particularly to a method for fabricating a semiconductor device in which double tungsten silicide films having different constructions are utilized in forming a gate electrode and is especially suitable for the fabrication of a highly-integrated semiconductor device.

2. Description of the Prior Art

Generally, when a gate electrode is formed by means of only a polysilicon in the semiconductor device, the more highly integrated the semiconductor device, the larger the resistance of a word line, and thereby, the lower the operating speed of the semiconductor device.

According to the above, a method for fabricating a semiconductor device which can prevent the increase of the resistance and the decrease of the operating speed as above, has been found. In the method, a metal silicide such as tungsten, having a low resistance, is laminated on the gate electrode.

A more detailed description of the above conventional fabricating method will be given hereinbelow.

FIG. 1 is a sectional view of a semiconductor device which shows the conventional method for fabricating a semiconductor device having a gate electrode formed by means of a tungsten silicide film.

In the conventional method, at first, an element isolating oxide film (not shown) is formed on a silicon substrate 1 by LOCOS method.

Then, a gate oxide film 2 is formed on the silicon substrate 1, and a polysilicon film 3 is deposited on the gate oxide film 2, as shown in FIG. 1. Thereafter, a tungsten silicide film 4 having a low resistance is deposited on the polysilicon film 3.

The following discusses the problems of the conventional method for fabricating a semiconductor device, as described above.

First, because the resistance of the gate must be low in order to achieve high integration and high-speed operation of the semiconductor device, the thickness of the tungsten silicide film must be relatively large compared with that of the polysilicon film in the conventional method for fabricating a semiconductor device.

Moreover, the thickness of the tungsten silicide film must be increased while the thickness of the polysilicon film must be decreased in order to improve the topology thereof in the conventional method for fabricating a semiconductor device.

Therefore, fluorine atoms contained in the tungsten silicide film come to be diffused into the gate oxide film in the succeeding processes under high temperature, so as to accelerate the degradation of the gate oxide film, thereby reducing yield and reliability of the semiconductor device.

SUMMARY OF THE INVENTION

The present invention has been made to overcome the above described problems of the prior arts, and accordingly, it is an objective of the present invention to provide a method for fabricating a semiconductor device by which the resistance of the gate electrode of the device is decreased and the topology thereof is improved. In addition, the method should improve the yield and the reliability of the device, thereby being suitable for the high integration of the device.

To achieve the above objectives, the present invention provides a method for fabricating a semiconductor device, the method comprising the steps of: preparing a semiconductor substrate; forming a gate oxide film on the semiconductor substrate and a polysilicon film on the gate oxide film; forming a lower tungsten silicide film having an amorphous construction on the polysilicon film, and forming an upper tungsten silicide film having an amorphous construction and a plurality of small grains between which gaps are defined, the upper tungsten silicide film being formed on the lower tungsten silicide film in series, the lower tungsten silicide film and the upper tungsten silicide film being formed by a low pressure chemical deposition method; and crystallizing the amorphous constructions of the lower tungsten silicide film and the upper tungsten silicide film simultaneously, with oxide films forming on the surfaces of the plurality of the small grains crystallized in the upper tungsten silicide film by subjecting the lower tungsten silicide film and the upper tungsten silicide film to heat treatment.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENT

Hereinafter, the present invention will be described in detail with reference to the drawings.

Figure 1:
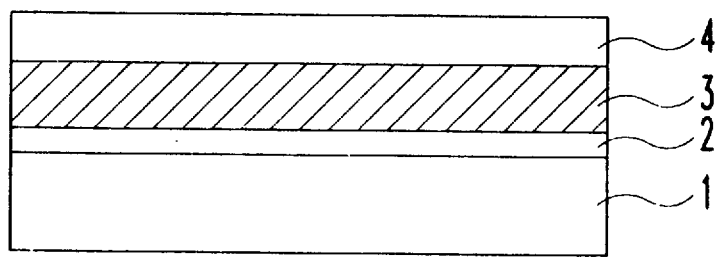
FIG. 1 is a sectional view of a semiconductor device which shows a conventional method for fabricating a semiconductor device having a gate electrode formed by a tungsten silicide film.
Figure 2A:
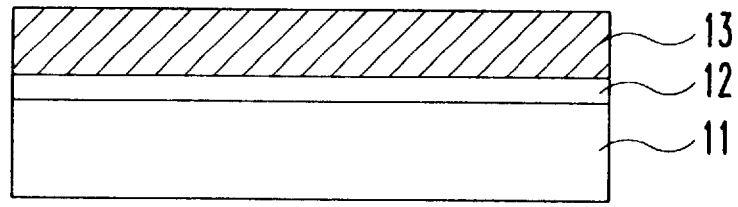
FIGS. 2A to 2C are sectional views of a semiconductor device which show a process of forming a gate electrode by a method for fabricating a semiconductor device according to the present invention.
Figure 2B:
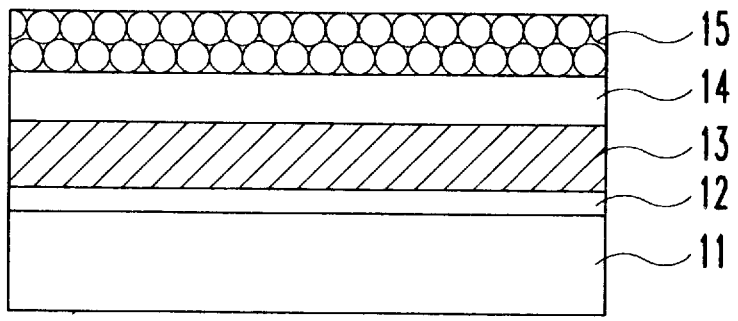
Figure 2C:
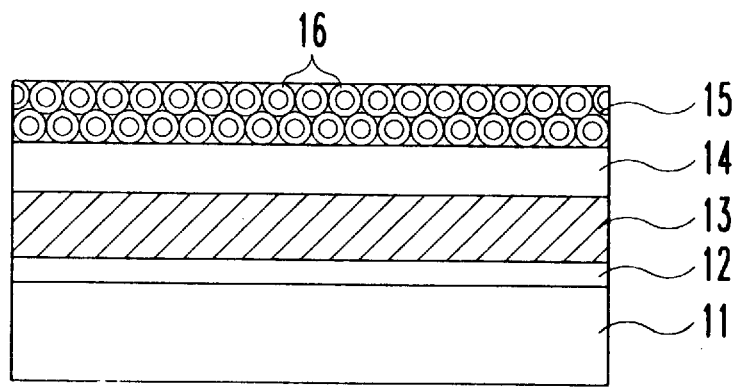

FIGS. 2A to 2C show a process of forming a gate electrode with a method for fabricating the semiconductor device according to the present invention.

In the method for fabricating the semiconductor device according to the present invention, at first, an element isolating oxide film (not shown) is formed on a silicon substrate 11 by LOCOS method.

Thereafter, a gate oxide film 12 is formed on the silicon substrate 11, and a polysilicon film 13 is deposited on the gate oxide film 12, as shown in FIG. 2A.

Thereafter, gases of WF6 and SiH4 are deposited on the polysilicon film 13 under a temperature between about 440° C. and 480° C. by the low pressure chemical vapor deposition (LPCVD) method, so as to form films having a thickness between about 1300 Å and 1500 Å in total. Between the two films, a lower tungsten silicide film 14 of an amorphous construction, having a thickness between about 700 Å and 800 Å, is formed on the polysilicon film 13. In addition, an upper tungsten silicide film 15 of an amorphous construction having a thickness between about 500 Å and 800 Å is formed on the lower tungsten silicide film 14, the upper tungsten silicide film 15 having a plurality of grains, as shown in FIG. 2B.

Thereafter, as shown in FIG. 2C, the lower tungsten silicide film 14 and the upper tungsten silicide film 15 are subjected to heat treatment under oxygen atmosphere with a temperature between about 700° C. and 900° C., so as to be crystallized.

In this case, oxygen is implanted into gaps between amorphous silicon layers of small grains in the upper tungsten silicide film 15 in the course of the above crystallization, while thinly oxidizing the surfaces of the crystallized grain system, thereby forming thin oxide films 16 on the surfaces.

The oxide films 16 capture fluorine atoms in the upper tungsten silicide film 15, thereby preventing the fluorine atoms from being diffused from the upper tungsten silicide film 15 to the gate oxide film 12 in the succeeding processes.

On the otherhand, the resistance value Rs of the gate electrode with respect to thickness of the polysilicon film and the double-formed tungsten silicide films has been observed as follows.

First, the resistance Rs has been measured at about 9 $\Omega/\square$ when the thickness of the polysilicon film 13 is about 700 Å and the entire thickness of the upper and the lower tungsten silicide films is about 1300 Å.

Furthermore, the resistance Rs has been measured at about 13 $\Omega/\square$ when the thickness of the polysilicon film 13 is about 1000 Å and the entire thickness of the upper and the lower tungsten silicide films is about 1000 Å.

In addition, the resistance Rs has been measured at about 11 $\Omega/\square$ when the thickness of the polysilicon film 13 is about 700 Å and the entire thickness of the upper and the lower tungsten silicide films is about 1300 Å.

Meanwhile, the breakdown of the gate oxide film, according to time in the semiconductor device using double silicide films as described, has been measured as nearly the same as the case of the prior art.

That is, in a semiconductor device made by the method according to the present invention, the resistance of the gate electrode is remarkably reduced without degrading the breakdown characteristic of the gate oxide film in comparison with that of the prior art.

As described above, the method for fabricating a semiconductor device according to the present invention has the following advantageous effects.

In the method for fabricating a semiconductor device according to the present invention, the ambient fluorine is implanted into and captured by the oxide films when the double tungsten silicide films are subjected to heat treatment under oxygen atmosphere, thereby forming thin oxide films on the surfaces of the small grains in the upper tungsten silicide film so that the fluorine atoms contained in the upper tungsten silicide film is prevented from being diffused into the lower gate oxide film during the succeeding processes under high temperature.

Therefore, according to the method for fabricating a semiconductor device according to the present invention, not only is the resistance of the gate electrode reduced, but also, the topology is improved because the tungsten silicide films prevent the degradation of the gate oxide film even when their thickness is increased.

Accordingly, the method for fabricating a semiconductor device according to the present invention is suitable for a highly-integrated semiconductor device due to the reduction of the resistance of the gate electrode and the improvement of topology enabled by the method.

Although the preferred embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A method for fabricating a semiconductor device, the method comprising the steps of:

preparing a semiconductor substrate;

forming a gate oxide film on said semiconductor substrate, and a poly silicon film on said gate oxide film;

subsequently forming a lower tungsten silicide film and an upper tungsten silicon film having an amorphous construction on said poly silicon film, wherein said amorphous construction has a plurality of small grains between which gaps are defined, said upper tungsten silicide film is being formed on said lower tungsten silicide film in series, and said lower tungsten silicide film and said upper tungsten silicide film is formed by a chemical deposition method; and crystallizing the amorphous construction of said lower tungsten silicide film and said upper tungsten silicide film and simultaneously forming oxide films on surfaces of the plurality of the small grains crystallized in said upper tungsten silicide film by subjecting said lower tungsten silicide film and said upper tungsten silicide film to heat treatment.

2. A method is claimed in claim 1, wherein said chemical vapor deposition method uses a low pressure chemical vapor deposition method.

3. A method as claimed in claim 1, wherein said lower tungsten silicide film and the upper tungsten silicide film are formed under a temperature between 400° C. and 500° C.

4. A method as claimed in claim 1, wherein said oxide films comprise fluorine in said upper tungsten silicide film.

5. A method as claimed in claim 1, wherein said heat treatment is carried out under a temperature between 700° C. and 900° C.

6. A method as claimed in claim 1, wherein said heat treatment is carried out under an oxygen atmosphere.

7. A method as claimed in claim 1, wherein the thickness of said polysilicon film is about 700 Å and the thickness of said entire tungsten silicide film is about 1300 Å.

* * * * *